US009972396B1

(12) United States Patent
Naik et al.

(10) Patent No.: US 9,972,396 B1
(45) Date of Patent: May 15, 2018

(54) SYSTEM AND METHOD FOR PROGRAMMING A MEMORY DEVICE WITH MULTIPLE WRITES WITHOUT AN INTERVENING ERASE

(71) Applicant: Western Digital Technologies, Inc., San Jose, CA (US)

(72) Inventors: Himanshu Naik, San Jose, CA (US); Mohan Dunga, Santa Clara, CA (US); Changyuan Chen, San Ramon, CA (US); Biswajit Ray, Huntsville, AL (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days. days.

(21) Appl. No.: 15/610,870

(22) Filed: Jun. 1, 2017

(51) Int. Cl.
| | |
|---|---|
| *G11C 16/00* | (2006.01) |
| *G11C 16/16* | (2006.01) |
| *G11C 11/56* | (2006.01) |
| *G11C 16/12* | (2006.01) |

(52) U.S. Cl.
CPC .......... *G11C 16/16* (2013.01); *G11C 11/5628* (2013.01); *G11C 16/12* (2013.01)

(58) Field of Classification Search
CPC ...... G11C 16/16; G11C 16/12; G11C 11/5628

USPC .......... 365/185.03, 195.22, 185.28
See application file for complete search history.

(56) References Cited

U.S. PATENT DOCUMENTS

| | | | |
|---|---|---|---|
| 9,589,645 B2 | 3/2017 | Dusija et al. | |
| 2014/0043901 A1* | 2/2014 | Kwak | G11C 16/10 365/185.03 |
| 2014/0181373 A1 | 6/2014 | George et al. | |
| 2017/0125104 A1 | 5/2017 | Baran et al. | |

\* cited by examiner

*Primary Examiner* — Tan T. Nguyen
(74) *Attorney, Agent, or Firm* — Brinks Gilson & Lione

(57) ABSTRACT

In solid-state memory, such as flash memory, a section of memory is typically erased prior to each time data is programmed therein. In contrast, systems and methods for programming a solid-state memory device with writes from different data sets without an intervening erase are disclosed. For example, the memory device may first erase a block and thereafter program the block with a first data set, with some cells in an erased state and other cells in a non-erased state. After programming the first data set into the block and without erasing the block, the memory device programs the block with a second data set that is at least partially different from the first data set. In this regard, some of the cells, which were in a non-erased state after programming with the first data set, are in an erased state after programming with the second data set.

29 Claims, 11 Drawing Sheets

| Parameters | Prior art-write | WWE-Write-1 | WWE-Write-2 |
|---|---|---|---|
| DVPGM | 2V | 1V | 1V |
| VPGM | Trim | Trim | Trim+2V |
| VCG_SLCV | Trim | Trim-1V | Trim+1V |
| VCG_SLCR | Trim | Trim-0.8V | Trim+0.8V |
| VREAD | Trim | Trim | Trim+1V |

SYSTEM AND METHOD FOR PROGRAMMING A MEMORY DEVICE WITH MULTIPLE WRITES WITHOUT AN INTERVENING ERASE

BACKGROUND

Flash memory is an electronic or solid-state type of non-volatile memory that is configured to retain data in the absence of a power supply. The flash memory is composed of individual flash memory cells that store one or more bits therein and may be organized in blocks. In order to program data within a block, the entire block must be erased. After erasing, the memory device may program data within the block. However, erasing the block may cause wear, thereby decreasing the useful life of the block.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
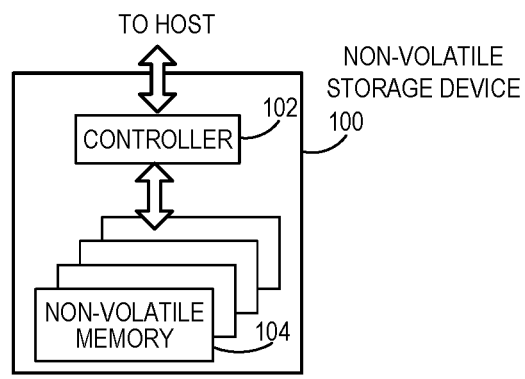
FIG. 1A is a block diagram of an exemplary non-volatile memory system.

As discussed in the background, the typical sequence of programming solid-state non-volatile memory, such as flash non-volatile memory, is first to erase a section of memory and thereafter to program data into the section of memory. For example, in order to program data into a block of memory, a flash non-volatile memory device first erases the block of memory. The erasing of the block places each of the cells within the block in an erased state. As discussed in more detail below, the memory device may interpret the erased state as being in the logic "1" state (e.g., in binary logic, the two values may be logic "0" and logic "1"). Subsequent to erasing the block, the memory device programs data into the block, with certain cells in the block being programmed to logic "0" (i.e., the memory device programs certain cells to change from the erased state (interpreted as logic "1") to the programmed state (interpreted as logic "0")). Thus, after programming, a first set of cells are in the erased state and a second set of cells are in a non-erased state (e.g., in the programmed state). In this regard, the memory device cannot program the cell, once programmed to logic "0", back to logic "1" without erasing the block. Thus, the memory device must erase the block in order to re-program the cells within new data.

In one implementation, the solid-state non-volatile memory device is configured to program a section of non-volatile memory, such as a block, with different data sets without an intervening erase operation being performed on the section of non-volatile memory. Solid-state non-volatile memory may include, for example, NAND flash memory (e.g., 2D or 3D), ReRAM, or any other non-volatile memory now known or later developed that performs an erase prior to programming to one or multiple levels. For example, the memory device may first erase a flash memory block and thereafter program the flash memory block with a first data set. After which, a first set of cells in the flash memory block are in the erased state and a second set of cells in the flash memory block are in a non-erased state (e.g., for single level cells, in the programmed state, or for multi-level cells, in one of a plurality of programmed states). Optionally, the memory device may read the first data set from the flash memory block using one or more read voltages. After programming the first data set into the flash memory block and without erasing the memory block, the memory device programs the flash memory block with a second data set. The second data set is at least partially different from the first data set. Thus, in one implementation, at least some of the second set of cells, which were in a non-erased state after programming with the first data set, are in another state (such as an erased state) after programming with the second data set. For example, for single level cells, at least some of the second set of cells, which were in the programmed state after programming with the first data set, are in a second erased state after programming the second data set. As discussed below, the second erased state may have a different Vt width than the first erased state (i.e., the erased state after erasing the block). As another example, for multi-level cells, at least some of the second set of cells, which were in one of the plurality of programmed states after programming with the first data set, are in a second erased state after programming the second data set. Again, the second erased state may have a different Vt width than the first erased state, such as a wider Vt width than the first erased state, as discussed further below. Optionally, the memory device may read the second data set from the flash memory block using one or more read voltages that are different from the read voltage used to read the first data set, as discussed in more detail below.

As one example, the first data set and the second data set may be the same size (e.g., 64 Kb of data). Further, the first data set may comprise a first sequence of logic "0"s and logic "1"s. Likewise, the second data set may comprise a second sequence of logic "0"s and logic "1"s. In this regard, at least one logic "0" at a certain part in the first sequence is a logic "1" at the same part in the second sequence.

Further, at least one logic "1" at another part in the first sequence is a logic "0" at the another part in the second sequence. Thus, in one implementation, in programming the flash memory block with the second data set, at least one cell (in programming single-level cell memory) or at least a part of one cell (in programming multi-level cell memory) changes its assigned value from logic "0" to logic "1". Alternatively, or in addition, in programming the flash memory block with the second data set, at least one cell or at least a part of one cell changes its assigned value from logic "1" to logic "0".

In one implementation, the non-volatile memory device uses one or more different programming parameters in programming the first data set into the section of memory and the second data set in the section of memory. As discussed in more detail below, a section of memory may be composed of memory cells. The non-volatile memory device may program the memory cells to be single-level cells (SLC) in which a single bit (e.g., a logic "1" or a logic "0") is stored therein, or may program the memory cells to be multiple-level cells (MLC) in which multiple bits are stored therein (e.g., in bi-level cells (BLC): logic "11", logic "10", logic "01", logic "00"; in triple-level cells (TLC): logic "111", logic "110", logic "101", logic "100", logic "011", logic "010", logic "001", logic "000").

The non-volatile memory device may program memory cells to be SLC by configuring the cell to have the correct amount of charge at the desired voltage state, such as at the erased state (interpreted as logic "1") or at the programmed state (interpreted as logic "0"), as discussed in more detail below. Likewise, in TLC, the non-volatile memory device may program memory cells to be TLC by configuring the cell to have the correct amount of charge at the desired voltage states, such as at the erased state (interpreted as logic "111"), at state A, state B, state C, state D, state E, state F or state G. One or more types of programming (and one or more programming voltages) may be used to program the cell into the desired state. For example, a first/foggy/fine or a foggy fine type of programming may be used, such as disclosed in U.S. Pat. No. 9,589,645, incorporated by reference herein in its entirety. Other types of programming are contemplated. After applying the programming voltage(s), the non-volatile memory device may use one or more predetermined verify voltages to determine whether the cell has been properly programmed.

Thus, in one implementation, the non-volatile memory device may use one or more different programming parameters (e.g., using different program voltages and/or different verify voltages) in programming the first data set and in programming the second data set. For example, the non-volatile memory device may use a first set of programming parameters in a first write (Write-1), and use a second set of programming parameters in a second write (Write-2), with one or more parameters in the second set being different from the first set. In this way, one or more of the programmed states resulting from programming the first data set into the flash block are different from the programmed states resulting from programming the second data set into the flash block. For example, as discussed in more detail below with regard to SLC, after programming the first write (Write-1), the flash block has an erased state-1 (corresponding to logic "1") and a programmed state-1 (corresponding to logic "0"). As shown in the figures, the erased state-1 has a certain voltage range and the programmed state-1 has another voltage range. Likewise, after programming the second write (Write-1), the flash block has an erased state-2 (corresponding to logic "1") and programmed state-2 (corresponding to logic "0"). Similarly, the erased state-2 has a certain voltage range and the programmed state-2 has another voltage range. The voltage range of the programmed state-2 is not coextensive with the voltage range of the programmed state-1. More specifically, the voltage range of the programmed state-2 is greater than the voltage range of the programmed state-1. Rather, in one implementation, the voltage range for programmed state-1 is completely subsumed within erased state-2. Thus, in a specific implementation, all of the states in the first write are contained within the erased state of the second write.

Though the discussion below focuses on flash non-volatile memory devices, other solid-state non-volatile memory devices are contemplated. Further, the discussion below focuses on erasing and programming a block in flash non-volatile memory. Other ways of segmenting non-volatile memory, other than by block, are contemplated for both erasing and programming. In addition, the discussion below focuses on SLC cells. The programming of MLC cells are likewise contemplated. In that regard, any discussion below regarding flash non-volatile memory devices may be applied to any other solid-state non-volatile memory devices now known or later developed. Likewise, any discussion regarding erasing or programming at the block level may be applied to other segmenting of the non-volatile memory now known or later developed. Further, any discussion regarding SLC programming may be applied to MLC programming.

Embodiments

The following embodiments describe non-volatile memory devices and related methods for performing multiple writes in a section of memory without an intervening erase operation on the section of memory. Before turning to these and other embodiments, the following paragraphs provide a discussion of exemplary non-volatile memory devices and storage modules that can be used with these embodiments. Of course, these are merely examples, and other suitable types of non-volatile memory devices and/or storage modules can be used.

FIG. 1A is a block diagram illustrating a non-volatile memory device 100. The non-volatile memory device 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host device or a host system and transmit command sequences for read, program, and erase operations to the non-volatile memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. One example of the firmware is a flash translation layer. In operation, when a host device needs to read data from or write data to the flash memory, it will communicate with the flash memory controller. In one implementation, if the host device provides a logical address to which data is to be read/written, the flash memory controller can convert the logical address received from the host to a physical address in the flash memory. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800. In one embodiment, the memory device 100 may be a card based system, such as a secure digital (SD) or a micro secure digital (micro-SD) card. In an alternate embodiment, the non-volatile memory device 100 may be part of an embedded memory device.

Although in the example illustrated in FIG. 1A, the non-volatile memory device 100 may include a single channel between the controller 102 and the non-volatile memory die(s) 104, the subject matter described herein is not limited to having a single memory channel. For example, in some NAND memory device architectures, 2, 4, 8 or more NAND channels may exist between the controller and the NAND memory die(s) 104, depending on controller capabilities. In any of the embodiments described herein, more than a single channel may exist between the controller and the memory die(s) 104, even if a single channel is shown in the drawings.

Figure 1B:
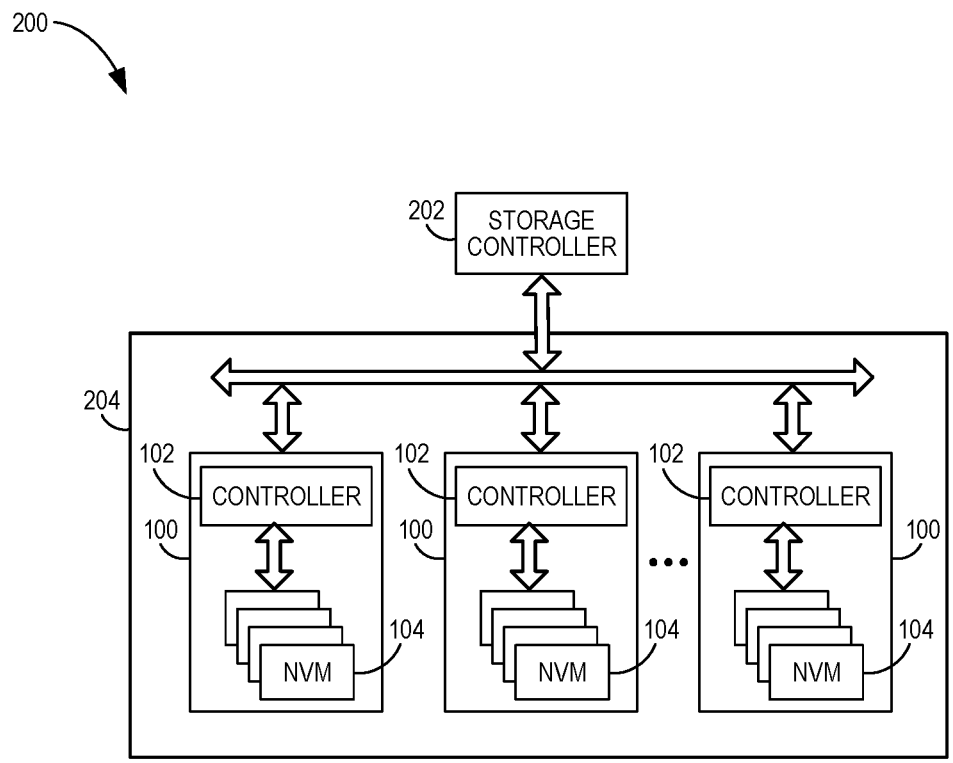
FIG. 1B is a block diagram of a storage module that includes a plurality of non-volatile memory systems and a host.

FIG. 1B illustrates a storage module 200 that includes plural non-volatile memory devices 100. As such, the storage module 200 may include a storage controller 202 that interfaces with a host 220 and with a storage system 204, which includes a plurality of non-volatile memory devices 100. The interface between the storage controller 202 and non-volatile memory devices 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
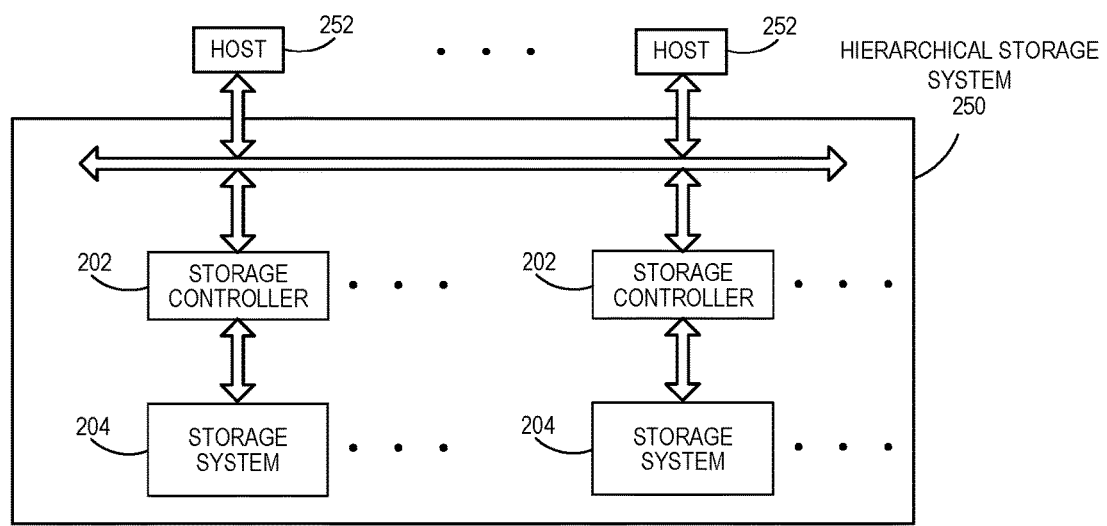
FIG. 1C is a block diagram of a hierarchical storage system.

FIG. 1C is a block diagram illustrating a hierarchical storage system 250. The hierarchical storage system 250 may include a plurality of storage controllers 202, each of which control a respective storage system 204. Host systems 252 may access memories within the hierarchical storage system 250 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one implementation, the hierarchical storage system 250 illustrated in FIG. 1C may be a rack mountable mass storage system that is accessible by multiple host computers, such as would be found in a data center or other location where mass storage is needed. In one implementation, host systems 252 may include the functionality described in host 220.

Figure 2A:
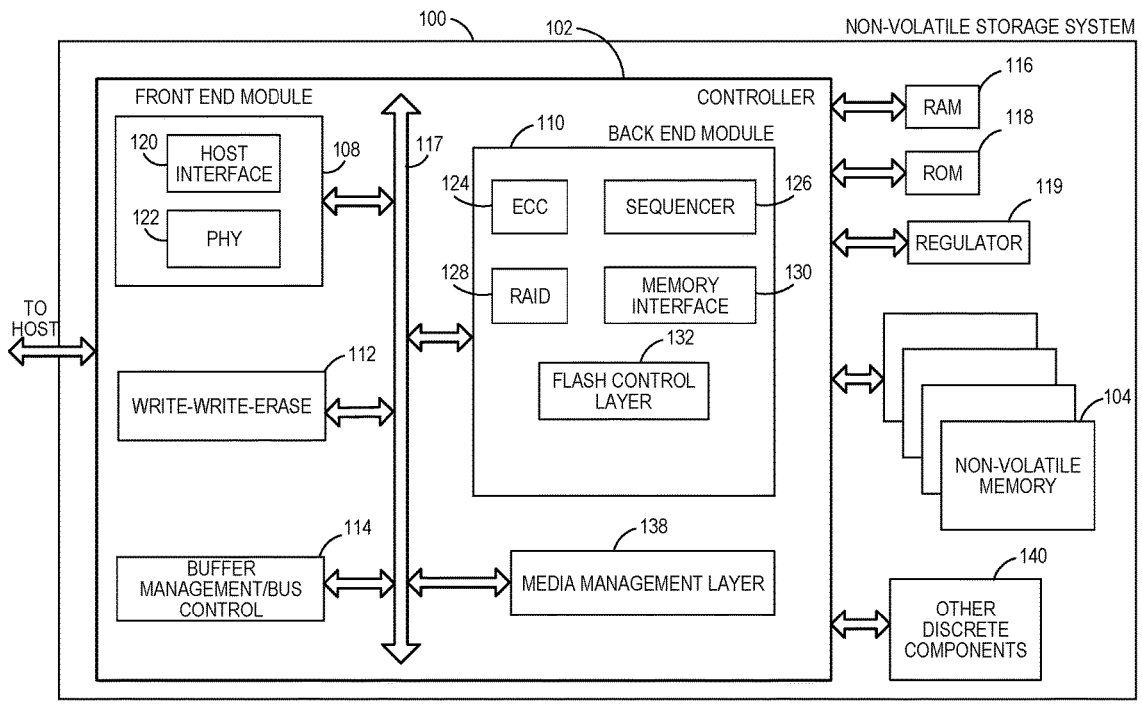
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory device 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus control module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory die(s) 104. As discussed in more detail below, the ECC engine may be tunable, such as to generate different amounts of ECC data based on the mode (e.g., generate normal mode ECC data in normal programming mode and generate burst mode ECC data in burst programming mode, with the burst mode ECC data being greater than the normal mode ECC data). The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory device 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Thus, the controller 102 may include one or more management tables for managing operations of storage system 100. One type of management table includes logical-to-physical address mapping table. The size of logical-to-physical address mapping table may grow with memory size. In this regard, the logical-to-physical address mapping table for high capacity storage device (e.g., greater than 32 G) may be too large to store in SRAM, are may be stored in non-volatile memory 104 along with user and host data. Therefore, accesses to non-volatile memory 104 may first require reading the logical-to-physical address mapping table from non-volatile memory 104.

Additional modules of the non-volatile memory device 100 illustrated in FIG. 2A may include a media management layer 138, which performs wear leveling of memory cells of the non-volatile memory die 104. The non-volatile memory device 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Other modules of the non-volatile memory device 100 illustrated in FIG. 2A may include write-write-erase module 112. As discussed in more detail below, the memory device may use the write-write-erase module 112 in order to perform multiple writes of different sets of data into a section of non-volatile memory, such as into one or more blocks of non-volatile memory. Though the module is titled a write-write-erase module 112, in which at least two writes are performed without an intervening erase operation, more than two writes may be performed without an intervening erase operation. For example, the memory device may perform three writes on the same section of memory without an intervening erase operation, such as write-1 writing a first data set, write-2 writing a second data set, and write-3 writing a third data set. As another example, the memory device may perform four or more writes on the same section of memory without an intervening erase operation.

Figure 2B:
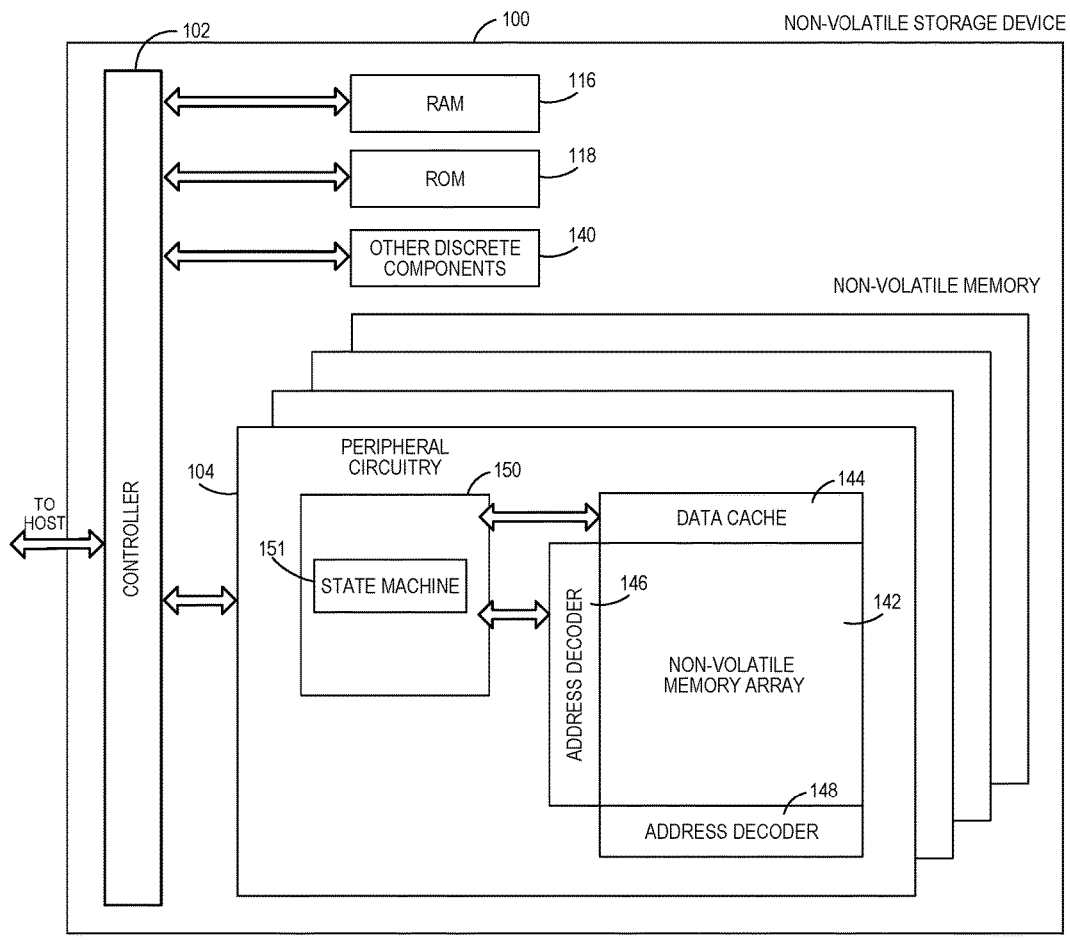
FIG. 2B is a block diagram of exemplary components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits of data per cell, or combinations thereof. For some example configurations, the multi-level cells (MLCs) may include triple-level cells (TLCs) that store three bits of data per cell.

Additionally, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

The non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 151 that provides status information to the controller 102. Other functionality of the state machine 151 is described in further detail below.

Figure 3:
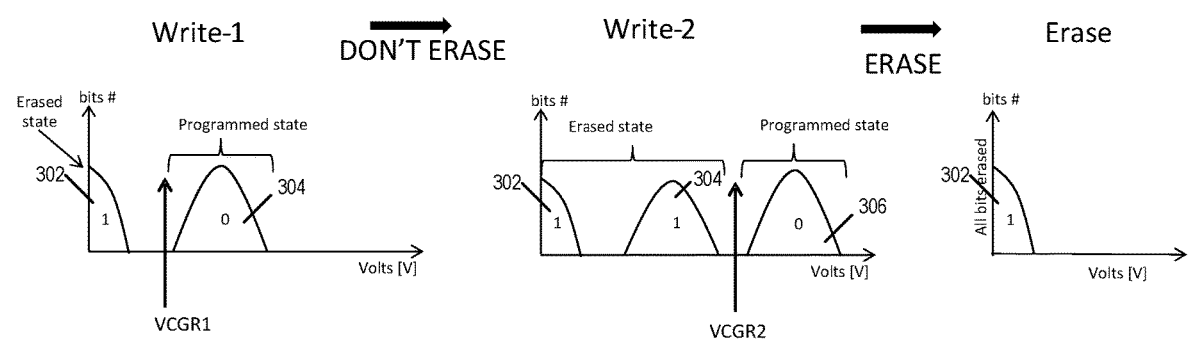
FIG. 3 is a series of graphs showing voltage versus bits for the erased state and the programmed state for a first write (Write-1), for a second write (Write-2) and for an erase.

FIG. 3 illustrates a series of graphs showing voltage versus bits for the erased state and the programmed state for a first write (Write-1), for a second write (Write-2) and for an erase. As shown, the graphs illustrate the states for programming a SLC, which includes two states (an erased state and a programmed state). Further, FIG. 3 illustrates that the erased state corresponds to logic "1" and the programmed state corresponds to logic "0". The graph in FIG. 3 on the far left shows the states after the first write (Write-1). In particular, after erasing the block, all of the cells in the block are in the erased state. After the first write (Write-1), certain bits are programmed to the programmed state. Thus, after the first write (Write-1), there are two sections or clumps of bits, with one 302 being the erased state (and assigned to logic "1") and a second 304 being the programmed state (and assigned to logic "0"). Further, VCGR1 voltage is used to program verify the levels for the first write (Write-1). After the first write, the non-volatile memory device may read the flash memory block.

After the first write (Write-1), the non-volatile memory device may perform a second write (Write-2) without performing an intervening erase operation. As shown, all of the states in the first write (Write-1), including the erased state 302 and the programmed state 304, are designated as the erased state. In this regard, the programmed state 304 in the first write (Write-1) is at least partly within the erased state of the second write (Write-2). In particular, as shown in FIG. 3, the programmed state 304 in the first write (Write-1) is entirely subsumed within the erased state of the second write (Write-2). Further, a new clump of bits, designated as the programmed state 306 is programmed in the second write (Write-2). Thus, after the second write (Write-2), there are three sections or clumps of bits, with two 302, 304 being the erased state (and assigned to logic "1") and a third 306 being the programmed state (and assigned to logic "0"). Finally, a cell may have been in the programmed state after the first write (Write-1). However, after the second write (Write-2), the cell may be in the erased state. In this instance where a specific cell changes its value from logic "0" to logic "1", the non-volatile memory device may determine that since the value for the specific cell is logic "1" and because the range of the erased state includes section 304, the memory device need no perform any further programming in order to designate the specific cell as logic "1". Conversely, in the instance where the specific cell changes its value from logic "1" to logic "0", the non-volatile memory device may determine that since the value for the specific cell is logic "0" and because the range of the erased state includes section 304, the memory device programs the cell, with the VCGR2 voltage is used to program verify the levels for the second write (Write-2). As shown, VCGR2 voltage is greater than VCGR1 voltage. Further, as shown, VCGR1 is in between 302 and 304, whereas VCGR2 is in between 304 and 306. After the second write, the non-volatile memory device may read the flash memory block. At the far right, the graph illustrates the bit distribution after performing the erase operation. As shown, there is section 302 showing that the cells are in the erased state.

In one implementation, VCGR1=1V. Thus, with the first write (Write-1), all of the erased states are less than 1 V and all of the programmed states are 1-2V. In this regard, the range of the programmed states is 1-2V. In order for the programmed data in the second write (Write-2) to distinguish over the previously programmed data, the second write is programmed at higher than 2V (e.g., 2.5V or 3.0V). Thus, the previous bits that were programmed in the first write now are interpreted as being erased. In particular, any cell subject to the first write may be programmed to either the previous logic "0" distribution or previous logic "1" distribution without hindering programming during the second write since these bits are 2V or less. So that, all of the previous data that was programmed in the first write may be treated in the subsequent write as the new erased state.

Figure 4A:
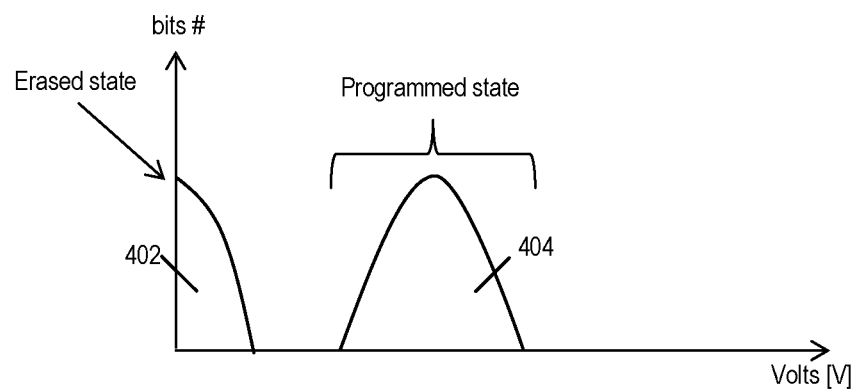
FIG. 4A is a graph of a prior art programming of the erased state and the programmed state for a single-level cell.

FIG. 4A is a graph of a prior art programming of the erased state 402 and the programmed state 404 for a single-level cell. FIG. 4A illustrates a typical SLC write, which involves an erase operation before every new data write. In this regard, 100,000 user cycles require 100,000 erase operations and 100,000 write operations.

Figure 4B:
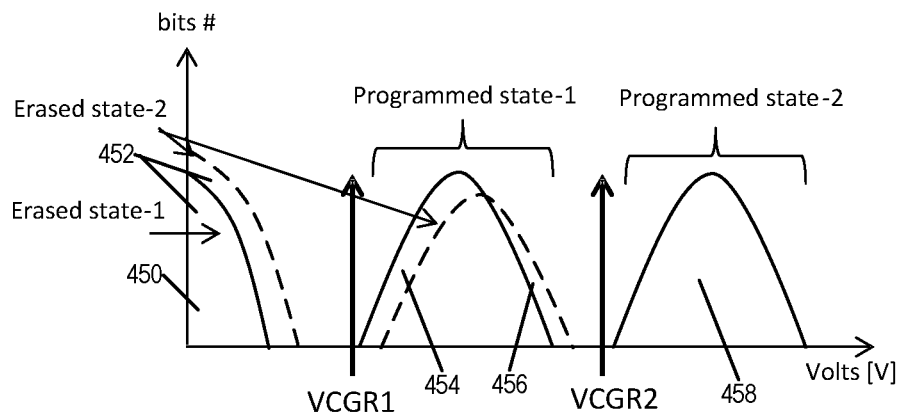
FIG. 4B is a graph of the erased and programmed state for multiple writes without an intervening erase, including programming a first write (Write-1) of the erased state-1 and the programmed state-1 for a single-level cell, and programming a second write (Write-2) of the erased state-2 and the programmed state-2 for a single-level cell.

In contrast, FIG. 4B is a graph of the erased and programmed state for multiple writes without an intervening erase, including programming a first write (Write-1) of the erased state-1 (450) and the programmed state-1 (454) for a single-level cell, and programming a second write (Write-2) of the erased state-2 (452, 456) and the programmed state-2 (458) for a single-level cell. As shown, after performing the programming for the second write (Write-2), there is some unwanted programming on erase cells so that the erased state-1 (450) moves to become erased state-2 (452). Further, the programmed state-1 (454) moves to become erased state-2 (456). Further, VCGR1 and VCGR2 are the program verify levels as discussed above. Thus, in one implementation, the Vt width for the erased state-1 (450) is smaller than the Vt width for the erased state-2 (452, 456).

In one implementation, the voltage range of erased state-1 (450) may be the same as the voltage range of erased state (402). Alternatively, the voltage range of erased state-1 (450) is different from the voltage range of erased state (402). For example, the voltage range of erased state-1 (450) may be smaller from the voltage range of erased state (402). In another implementation, the voltage range of programmed state-1 (454) may be the same as the voltage range of programmed state (404). Alternatively, the voltage range of programmed state-1 (454) is different from the voltage range of programmed state (404). For example, the voltage range of programmed state-1 (454) may be smaller from the voltage range of programmed state (404). In still another implementation, the voltage range of programmed state-2 (458) may be the same as the voltage range of programmed state (404). Alternatively, the voltage range of programmed state-2 (458) is different from the voltage range of programmed state (404). For example, the voltage range of programmed state-2 (458) may be smaller from the voltage range of programmed state (404).

Further, the voltage range of programmed state-2 (458) may be the same as the voltage range of programmed state-1 (454). Alternatively, the voltage range of programmed state-2 (458) is different from the voltage range of programmed state-1 (454). For example, the voltage range of programmed state-2 (458) may be smaller from the voltage range of programmed state-1 (454). As another example, the voltage range of programmed state-2 (458) may be larger than the voltage range of programmed state-1 (454). For example, the Vt width for the programmed state-1 (454) is larger than the Vt width for the programmed state-2 (458). In this regard, the different programmed and erased states may have the same or different tightness for the first write and the second write.

For single level cell programming with a write-write-erase cycle (in which there are two consecutive writes), there may be four state changes from the first write to the second write: (1) erased state-1 to erased state-2; (2) erased state-1 to programmed state-2; (3) programmed state-1 to erased state-2; and (4) programmed state-1 to programmed state-2. With regard to (1), as shown in FIG. 4B, transitioning from erased state-1 (450) to erased state-2 (452) requires no intentional programming since erased state-1 (450) is within erased state-2 (452). Further, with regard to (2), transitioning from erased state-1 (450) to programmed state-2 (458) includes programming since programmed state-2 (458) is at a higher Vt range than erased state-1 (450). With regard to (3), transitioning from programmed state-1 (454) to erased state-2 (452) requires no intentional programming since programmed state-1 (454) is within erased state-2 (452). In particular, since the memory device has a first Vt range for erased state-1 (450) for the first write and a second Vt range (which is wider) for erased state-2 (452) for the second write, the memory device interprets the amount of charge that was put into the respective cell for programmed state-1 (454) as being part of erased state-2 (452). In this way, changing the respective cell to an erased state (e.g., erased state-2 (452)) does not necessitate inputting additional charge. Rather, the change to the erased state may be performed by changing the Vt range. Finally, with regard to (4), transitioning from programmed state-1 (454) to programmed state-2 (452) includes programming since programmed state-2 (458) is at a higher Vt range than programmed state-1 (454). In addition, reading of the cells after the second write may be different than the reading of the cells after the first write. As discussed with regard to FIG. 6, the voltages used to read the cells after the second write to determine whether a respective cell is in erased state-2 (452) or in programmed state-2 (458) are different from the voltages used to read the cells after the first write to determine whether the respective cell is in erased state-1 (450) or in programmed state-1 (454).

Though FIG. 4B only illustrates a single sequence of two writes, the non-volatile memory device may iterate through pre-defined sequences. As one example, the following sequence may be performed: erase; program-1 (performing the first write); program-2 (performing the second write); erase; program-1 (performing the first write); program-2 (performing the second write); etc. As another example, the following sequence may be performed: erase; program-1 (performing the first write); program-2 (performing the second write); program-3 (performing the third write); erase; program-1 (performing the first write); program-2 (performing the second write); program-3 (performing the third write); etc. As still another example, the following sequence may be performed: erase; program-1 (performing the first write); erase; program-1 (performing the first write); program-2 (performing the second write); erase; etc. Further, this implementation includes one erase operation for writing two or more different sets of data. In this regard, the erase degradation is reduced (e.g., by at least ½). For example, with a Write-Write-Erase sequence, 100,000 user cycles include 50,000 erase operations, 50,000 times to program state-1, and 50,000 times to program state-2.

Thus, in one implementation, for a program operation, the non-volatile memory device programs a respective cell to a state as defined by a certain verify Vt level (e.g., VCGV). In this regard, the memory device may place a certain amount of charge as shown in FIG. 4B. During a subsequent read, the non-volatile memory device reads the same programmed state with a read level (e.g., VCGR). In one implementation, VCGR is same or less (e.g., by few tens of mV) compared to VCGV. As shown in FIG. 4B, VCGR2 is an indicator of both verify/read voltage. In this regard, the programmed state-2 may be verified to a higher Vt level and is read using a higher read Vt level compared to Programmed state-1.

Figure 5:
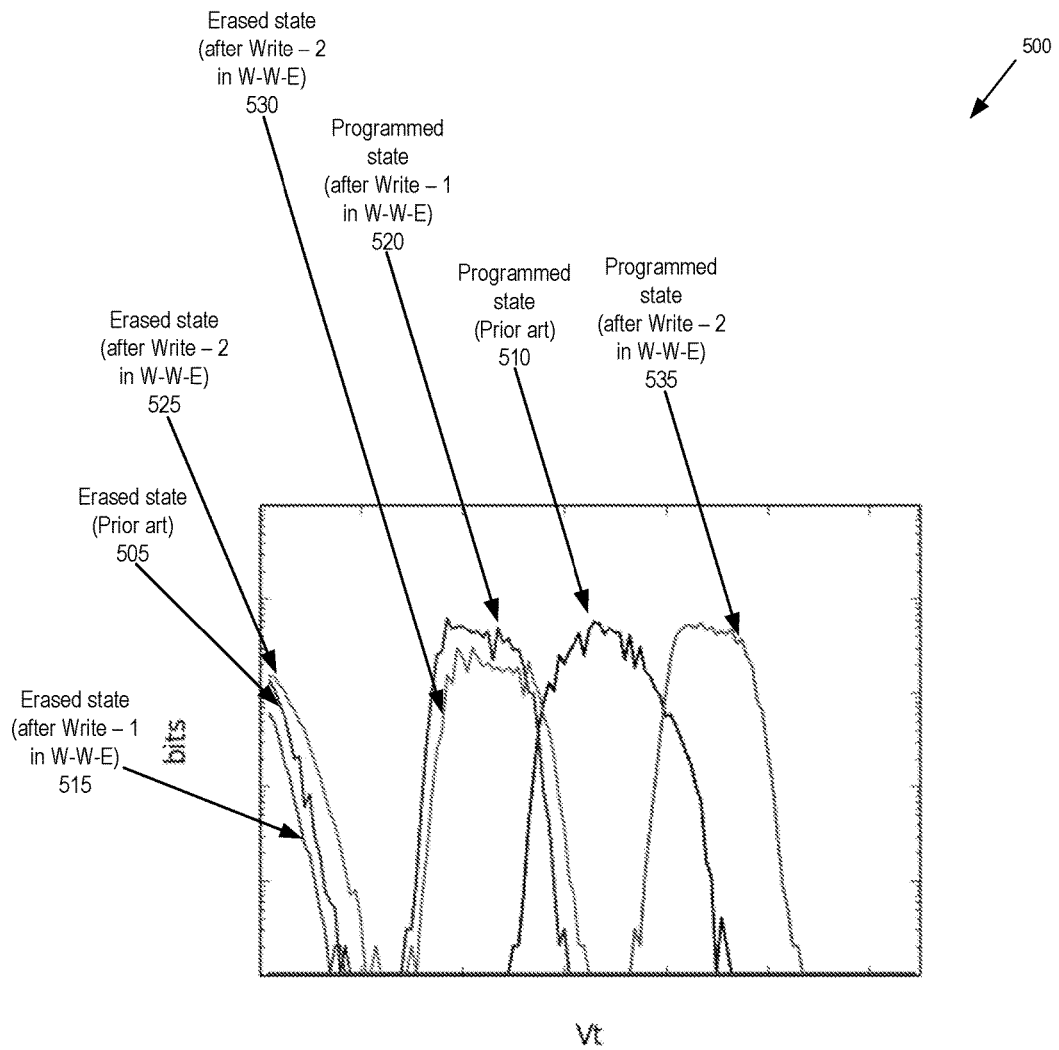
FIG. 5 is a graph of the Vt distribution with prior art programming and programming according to the Write-Write-Erase (WWE) methodology.

FIG. 5 is a graph 500 of the Vt distribution with prior art programming and programming according to the Write-Write-Erase (WWE) methodology. FIG. 5 illustrates the erased state 505 and programmed state 510 for prior art programming. In one implementation, the erased state and the programmed state after the first write (Write-1) is identical to the erased state 505 and the programmed state 510 for prior art programming. Alternatively, the erased state 515 and the programmed state 520 after the first write (Write-1) is different than the erased state 505 and the programmed state 510 for prior art programming, as shown in FIG. 5. For example, the erased state 515 and the programmed state 520 after the first write (Write-1) is at lower voltage ranges than the erased state 505 and the programmed state 510 for prior art programming. FIG. 5 further illustrates the erased state 525, 530 and the programmed state 535 after the second write (Write-2). As discussed above, because of the second write, there may be a spreading out or movement of the previous states of written in the first write (Write-1). In particular, erased state 515 moves to erased state 525 and programmed state 520 moves to erased state 530. Further, as shown, the programmed state 535 is at a higher voltage range than the programmed state 510 for prior art programming. In that regard, the programmed state 520 after the first write has a lower voltage range than the programmed state 510 for prior art programming whereas the programmed state 535 after the second write has a higher voltage range than the programmed state 510 for prior art programming.

Figure 6:
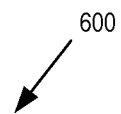
FIG. 6 is a table listing the parameters for a prior art write, for a first write (Write-1) under the WWE methodology and for a second write (Write-2) under the WWE methodology.

FIG. 6 is a table 600 listing the parameters for a prior art write, for a first write (Write-1) under the WWE methodology and for a second write (Write-2) under the WWE methodology. In one implementation, when programming data into memory, the program settings may include the TRIM setting, which may include one, some, any combination, or all of the following: a program voltage TRIM setting (VPGM, which may comprise the voltage applied on the wordline in order to program the cell); a step-up voltage TRIM setting (DVPGM, which may comprise a change in the program voltage at different programming iterations); skip verify level (e.g., how many programming pulses are input before verifying a certain level of voltage); verify voltage (VCG_SLCV, which may comprise the voltage to which you program the state); and a program pulse width (PPW). Other or different program settings are contemplated. In this regard, the various components of a specific TRIM setting (e.g., VPGM, DVPGM, skip verify level, verify voltage and PPW)

Further, in one implementation, the DVPGM may be the same for the first write (Write-1) as for the second write (Write-2), such as illustrated in FIG. 6. Alternatively, the DVPGM for the first write (Write-1) may be different than the second write (Write-2). For example, the DVPGM for the first write (Write-1) may be greater than the second write (Write-2). As another example, the DVPGM for the first write (Write-1) may be less than the second write (Write-2). With different DVPGM for the first write and the second write, the programming speed for the first write (Write-1) may be different than the second write (Write-2).

In addition, the program verify voltages for one or both of the writes may be different from the typical program verify voltage. For example, as shown in FIG. 5, the prior art VCG_SLCV equals 2V, whereas VCG_SLCV for the first write is approximately 1V and VCG_SLCV for the second write is approximately 3V.

Also, the cells may be programmed in a sequence of program/verify, and may undergo a number of program loops until the cells are sufficiently programmed. In practice, the number of program loops may be the same for a typical programming as for the first write and for the second write. For example, the average program loop for the typical programming may be 3 loops (program/verify; program/ verify; program/verify) while average program loop for each of the first write and for the second write may likewise be 3 loops. In this regard, this timing aspect of performing the programming is unchanged.

Because the programming is different for the first write (Write-1) and for the second write (Write-2), the read voltages likewise are different for reading the data from the cells after performing the first write or the second write. For example, VCG_SLCR is the voltage to perform the read in order to determine whether the cell is in the erased state or in the programmed state. VREAD is the voltage applied to the wordlines that are not currently being read. For example, in a 48 wordline block, in which wordline 24 is being read, VCG_SLCR is applied to wordline 24 and VREAD is applied to the other wordlines in the block.

As shown in FIG. 6, VCG_SLCV=Trim−1V for the first write and =Trim+1V for the second write. In one implementation, the VCG_SLCR is the same offset as the VCG_SLCV. Thus, VCG_SLCR=Trim−1V for reading after the first write and =Trim+1V for reading after the second write. Alternatively, the VCG_SLCR is different from (e.g., less than) the VCG_SLCV. As shown in FIG. 6, VCG_SLCR=Trim−0.8V for reading after the first write and =Trim+0.8V for reading after the second write. As shown in FIG. 6, for the first write, the non-volatile memory device may program to 1V; however, the programmed state may have a smaller lower tail below 1V because of read noise or data retention issues (e.g., the state shifts down over time). In order to discount the downward shift, when performing the read, the read voltage (VCG_SLCR) may be slightly less than the verify voltage (VCG_SLCV).

The disclosed scheme may result in reduced program/erase cycle degradation. For example, smaller erase tail degradation and improved data retention may result due to a lower number of erase operations for the same number of program (write) operations. Further, the prior art write-erase programming may have greater HTDR degradation than the write-write-erase methodology.

Figure 7:
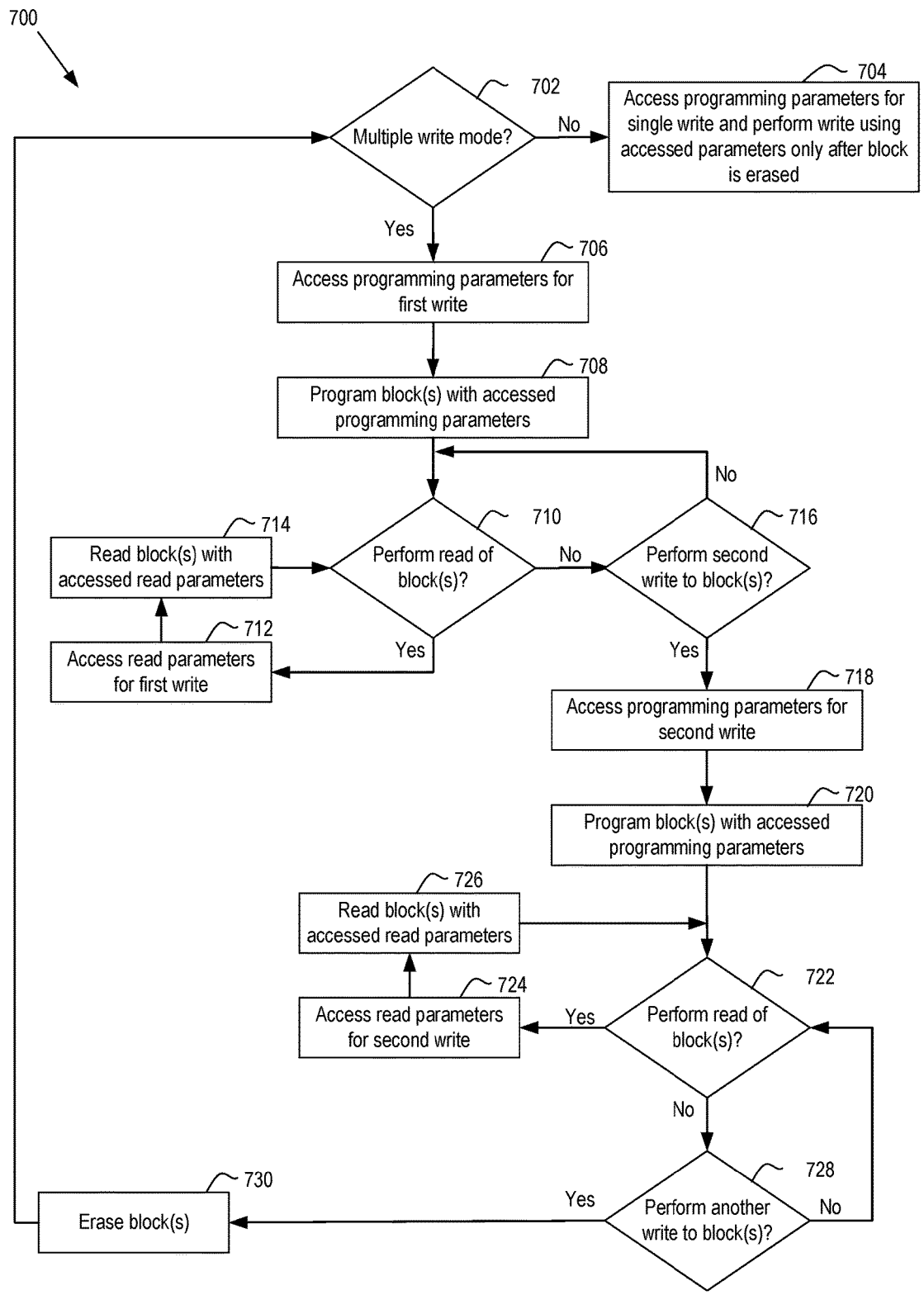
FIG. 7 is a flow chart of an example method of multiple writes without an intervening erase.

FIG. 7 is a flow chart 700 of an example method of multiple writes without an intervening erase. At 702, it is determined whether the mode is for multiple writes after an erase or for a single write after an erase. In one implementation, the entire life of the non-volatile memory device is in the multiple write mode. Alternatively, only a portion of the life of the non-volatile memory device is in the multiple write mode. For example, the multiple write mode may be during a predetermined portion of the age of respective blocks subject to the write. In particular, as blocks age, the programming of the states in the block may be more difficult (e.g., the humps associated with the different states may become wider). Thus, it may be more difficult to transition from the states associated with the first write to the states associated with the second write. In that regard, the multiple write mode may be until a predetermined age associated with the block (e.g., a predetermined number of program/erase cycles), If the non-volatile memory device is not in multiple write mode, at 704, the programming parameters for single write are accessed and the write is performed using the accessed parameters only after block is erased. If the non-volatile memory device is in multiple write mode, at 706, the programming parameters for the first write are accessed (such as the parameters listed in FIG. 6), and at 708, the block(s) are programmed with the accessed parameters.

At 710, it is determined whether to perform a read on the block(s). If so, at 712, the read parameters are accessed for reading after the first write (such as the parameters listed in FIG. 6), and at 714, the block(s) are read with the accessed parameters. If not, at 716, it is determined whether a second write is to be performed on the block(s). If not, the flow chart 700 loops back to 710. If so, at 718, the programming parameters for the second write are accessed (such as the parameters listed in FIG. 6), and at 720, the block(s) are programmed with the accessed parameters.

At 722, it is determined whether to perform a read on the block(s). If so, at 724, the read parameters are accessed for reading after the second write (such as the parameters listed in FIG. 6), and at 726, the block(s) are read with the accessed parameters. If not, at 716, it is determined whether another write is to be performed on the block(s). If not, the flow chart 700 loops back to 722. If so, at 730, the block(s) are erased and the flow chart 700 loops back to 702.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

The invention claimed is:

1. A method for programming a non-volatile memory device comprising:
   programming a section of non-volatile memory as single-level cells that store a first set of data, the single-level cells programmed to a first erased state or a first programmed state;
   after programming the section of non-volatile memory as single-level cells that store the first set of data and without erasing the section of non-volatile memory, determining, based on an indication of wear of at least a part of the non-volatile memory, whether to program the section of non-volatile memory with a second set of data without erasing the section of non-volatile memory; and
   responsive to determining to program the section of non-volatile memory with the second set of data without erasing the section of non-volatile memory, programming the section of non-volatile memory as single-level cells that store the second set of data, the single-level cells programmed to a second erased state or a second programmed state,
   wherein the first programmed state and the second programmed state are not coextensive.

2. The method of claim 1, wherein the first programmed state and the second programmed state do not overlap.

3. The method of claim 2, wherein the first programmed state and the second erased state at least partly overlap.

4. The method of claim 3, wherein the first programmed state is completely within the second erased state.

5. The method of claim 2, wherein the second programmed state is at a higher voltage range than the first programmed state.

6. The method of claim 2, wherein a voltage range of the second erased state is greater than a voltage range of the first erased state.

7. The method of claim 1, wherein, after storing the first set of data into the section of non-volatile memory, at least one cell in the section of non-volatile memory is programmed to logic 0; and
   wherein, after storing the second set of data into the section of non-volatile memory, the at least one cell in the section of non-volatile memory is programmed to logic 1.

8. The method of claim 1, wherein the section of non-volatile memory comprises a flash memory block.

9. The method of claim 1, wherein the indication of wear of at least a part of the non-volatile memory comprises a number of program/erase cycles for the section of non-volatile memory.

10. The method of claim 1, wherein programming the section of non-volatile memory as single-level cells that store the first set of data uses a first set of programming parameters;
wherein programming the section of non-volatile memory as single-level cells that store the second set of data uses a second set of programming parameters; and
wherein the first set of programming parameters is different from the second set of programming parameters.

11. The method of claim 10, wherein the first set of programming parameters comprises a first programming step;
wherein the second set of programming parameters comprises a second programming step; and
wherein the first programming step is different from the second programming step.

12. A solid state non-volatile memory device comprising:
non-volatile memory comprising one or more sections; and
a controller in communication with the non-volatile memory, the controller configured to:
erase a section of non-volatile memory such that all cells in the section of non-volatile memory are set to logic 1;
program the section of non-volatile memory with a first set of data, wherein at least one cell in the section of non-volatile memory after programming is set to logic 0;
after programming the section of non-volatile memory with the first set of data and without erasing the section of non-volatile memory, determine, based on age of the section of non-volatile memory, whether to program the section of non-volatile memory with a second set of data without erasing the section of non-volatile memory; and
responsive to determining to program the section of non-volatile memory with the second set of data without erasing the section of non-volatile memory, program the section of non-volatile memory with the second set of data, the second set of data being different than the first set of data and, after programming, changes the at least one cell in the section of non-volatile memory from a logic 0 to a logic 1.

13. The solid state non-volatile memory device of claim 12, wherein the controller is further configured to:
after programming the section of non-volatile memory with the first set of data, read the first set of data from the section of non-volatile memory using a first read voltage; and
after programming the section of non-volatile memory with the second set of data, read the second set of data from the section of non-volatile memory using a second read voltage, the second read voltage being different from the first read voltage.

14. The solid state non-volatile memory device of claim 13, wherein the controller is configured to program the section of non-volatile memory with the first set of data by programming the cells as single-level cells that store a single bit of data per cell according to the first set of data; and
wherein the controller is configured to program the section of non-volatile memory with the second set of data by programming the cells as single-level cells that store a single bit of data per cell according to the second set of data.

15. The solid state non-volatile memory device of claim 14, wherein the second read voltage is greater than the first read voltage.

16. The solid state non-volatile memory device of claim 12, wherein the section of non-volatile memory comprises a flash memory block.

17. The solid state non-volatile memory device of claim 12, wherein the controller is configured to program the section of non-volatile memory with the first set of data by programming the cells as multi-level cells that store multiple bits of data per cell according to the first set of data; and
wherein the controller is configured to program the section of non-volatile memory with the second set of data by programming the cells as multi-level cells that store multiple bits of data per cell according to the second set of data.

18. A method for programming a non-volatile memory device comprising:
erasing a section of non-volatile memory so that cells in the section of non-volatile memory are in an erased state;
performing a first programming of the section of non-volatile memory such that a first set of cells are in the erased state and a second set of cells are in a non-erased state;
after programming the section of non-volatile memory such that the first set of cells are in the erased state and the second set of cells are in a non-erased state and without erasing the section of non-volatile memory, determining whether the non-volatile memory is in a portion of its life to perform multiple writes without an intervening erase; and
responsive to determining that the non-volatile memory is in a portion of its life to perform multiple writes without an intervening erase, performing, without the intervening erase, a second programming of the section of non-volatile memory such that at least some of the cells in the second set of cells are changed from the non-erased state to another state.

19. The method of claim 18, wherein performing the second programming is such that at least some of the cells in the first set of cells are changed from a first erased state to a second programmed state.

20. The method of claim 19, wherein performing the second programming is such that at least some of the cells in the second set of cells are changed from a first programmed state to a second programmed state.

21. The method of claim 18, wherein, after performing the first programming but before performing the second programming, the non-volatile memory device has a first Vt width for interpreting whether a respective cell is in the erased state;
wherein, after performing the second programming, the non-volatile memory device has a second Vt width for interpreting whether a respective cell is in the erased state; and
wherein the second Vt width is wider than the first Vt width.

22. The method of claim 21, wherein data for the first programming assigns the non-erased state to the respective cell;
wherein data for the second programming assigns the erased state to the respective cell;

wherein, after performing the first programming but before the second programming, the non-volatile memory device interprets charge in the respective cell as being in the non-erased state; and wherein, after the second programming, the non-volatile memory device interprets the charge in the respective cell as being in the erased state, such that a state of the respective cell is changed from the non-erased state to the erased state without requiring programming of the respective cell.

23. The method of claim 18, wherein programming the section of non-volatile memory so that the first set of cells are in the erased state and the second set of cells are in a non-erased state comprises programming the cells as single level cells so that the first set of cells are in a first erased state and so that the second set of cells are in a first programmed state; and wherein programming the section of non-volatile memory so that at least some of the cells in the second set of cells are changed from the non-erased state to the another state comprises programming the cells as single level cells so that the at least some of the cells in the second set of cells are changed from the first programmed stated to a second erased state.

24. The method of claim 23, wherein the second erased state has a Vt width that is wider than a Vt width of the first erased state.

25. The method of claim 18, wherein programming the section of non-volatile memory so that the first set of cells are in the erased state and the second set of cells are in a non-erased state comprises programming the cells as multi-level cells so that the first set of cells are in a first erased state and so that the second set of cells are in one of a plurality of programmed states; and wherein programming the section of non-volatile memory so that at least some of the cells in the second set of cells are changed from the non-erased state to the another state comprises programming the cells as multi-level cells so that the at least some of the cells in the second set of cells are changed from the one of the plurality of programmed states to a second erased state, wherein the second erased state has a Vt width that is wider than a Vt width of the first erased state.

26. The method of claim 18, wherein the second set of cells store data as multi-level cells (MLCs).

27. A solid-state non-volatile memory device comprising:

means for programming a first data set into a section of non-volatile memory according to a first set of states;

means for determining, based on a number of program/erase cycles for the section of non-volatile memory, whether to program the section of non-volatile memory with a second data set without an intervening erase;

responsive to determining to program the section of non-volatile memory with the second data set without an intervening erase, means for programming the second data set into the section of non-volatile memory according to a second set of states without an intervening erase operation, wherein the first set of states is at least partly different than the second set of states; and means for erasing the section of non-volatile memory after the section of non-volatile memory is programmed with the first data set and the second data set.

28. The solid-state non-volatile memory device of claim 27, wherein the section of non-volatile memory comprises a block of flash memory.

29. The solid-state non-volatile memory device of claim 27, wherein the first set of states is entirely subsumed within an erase state of the second set of states.

\* \* \* \* \*